(12) United States Patent
Huang

(10) Patent No.: US 11,972,838 B2
(45) Date of Patent: Apr. 30, 2024

(54) SIGNAL PROCESSING CIRCUIT, CHIP AND ELECTRONIC DEVICE

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 156 days.

(21) Appl. No.: 17/660,154

(22) Filed: Apr. 21, 2022

(65) Prior Publication Data

US 2022/0358979 A1    Nov. 10, 2022

(30) Foreign Application Priority Data

May 10, 2021   (CN) .......................... 202110506675.3

(51) Int. Cl.
| | |
|---|---|
| *G11C 8/06* | (2006.01) |
| *G11C 7/10* | (2006.01) |
| *G11C 8/18* | (2006.01) |

(52) U.S. Cl.
CPC .............. *G11C 8/06* (2013.01); *G11C 7/1072* (2013.01); *G11C 7/109* (2013.01); *G11C 8/18* (2013.01)

(58) Field of Classification Search
CPC ........... G11C 8/06; G11C 8/18; G11C 7/1072; G11C 7/109
See application file for complete search history.

(56) References Cited

U.S. PATENT DOCUMENTS

| | | | |
|---|---|---|---|
| 8,169,851 B2 * | 5/2012 | Chou ...................... | G11C 7/222 365/233.13 |
| 10,063,234 B1 * | 8/2018 | Mazumder ..... | H03K 19/017509 |
| 10,679,683 B1 | 6/2020 | Chen et al. | |
| 11,106,237 B2 * | 8/2021 | Choi ......................... | G06F 5/06 |
| 11,456,024 B2 * | 9/2022 | Uemura ........... | G11C 29/50012 |

* cited by examiner

*Primary Examiner* — Son L Mai

(74) *Attorney, Agent, or Firm* — Syncoda LLC; Feng Ma

(57) ABSTRACT

A signal processing circuit includes a first signal latch circuit, a second signal latch circuit, and a decoder. The first signal latch circuit receives a command address signal and is driven by an even clock; the second signal latch circuit receives the command address signal and is driven by an odd clock; and the decoder is connected to the first signal latch circuit and the second signal latch circuit, and outputs a control signal. Both the even clock and the odd clock have a frequency equal to that of a reference clock, and both the even clock and the odd clock have a rising edge aligned with a rising edge of the reference clock.

19 Claims, 20 Drawing Sheets

SIGNAL PROCESSING CIRCUIT, CHIP AND ELECTRONIC DEVICE

CROSS-REFERENCE TO RELATED APPLICATION

This application claims priority to Chinese Patent Application No. 202110506675.3 filed on May 10, 2021, the disclosure of which is hereby incorporated by reference in its entirety.

BACKGROUND

A dynamic Random Access Memory (DRAM) is a kind of semiconductor memory with the main functional principle of using the amount of charges stored in a capacitor to represent whether a binary bit (bit) is 1 or 0.

In order to realize that the amount of charges stored in the capacitor can be used to represent whether a binary bit is 1 or 0, a signal processing circuit that collects, decodes and controls a command address (command/address, C/A) signal under a parity clock is often provided in the DRAM.

SUMMARY

The disclosure relates to the technical field of integrated circuits, and in particular, to a signal processing circuit, a chip and an electronic device.

On the first aspect, the disclosure provides a signal processing circuit. The circuit includes: a first signal latch circuit that receives a command address signal and is driven by an even clock; a second signal latch circuit that receives the command address signal and is driven by an odd clock; and a decoder that is connected to the first signal latch circuit and the second signal latch circuit and outputs a control signal; wherein a frequency of the even clock and a frequency of the odd clock are both equal to half a frequency of a reference clock, and a rising edge of the even clock and a rising edge of the odd clock are aligned with a rising edge of the reference clock.

In a second aspect, the disclosure provides a signal processing circuit, including: a first signal latch circuit that receives a command address signal and is driven by an even clock; a second signal latch circuit that receives the command address signal and is driven by an odd clock; a first decoder that is connected to the first signal latch circuit and outputs an even control signal; and a second decoder that is connected to the second signal latch circuit and outputs an odd control signal; wherein a frequency of the even clock and a frequency of the odd clock are both equal to half a frequency of a reference clock, and a rising edge of the even clock is aligned with a rising edge of the reference clock, and a falling edge of the odd clock is aligned with the rising edge of the reference clock.

In a third aspect, the disclosure provides a chip including any signal processing circuit of the first aspect or any signal processing circuit of the second aspect.

In a fourth aspect, the disclosure provides an electronic device including the chip of the second aspect.

BRIEF DESCRIPTION OF THE DRAWINGS

In order to illustrate the technical solutions in the disclosure or the some implementatiions more clearly, the accompanying drawings required in the description of the embodiments or the some implementatiions will be introduced briefly below. It is apparent that the accompanying drawings in the following description are some embodiments of the present disclosure, for those of ordinary skill in the art, other accompanying drawings can also be obtained based on these accompanying drawings without any creative effort.

DETAILED DESCRIPTION

Figure 1:
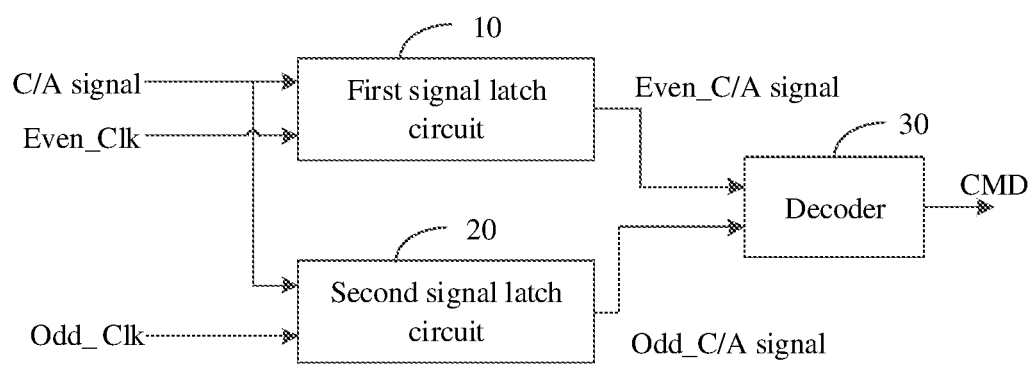
FIG. 1 illustrates a first schematic structural diagram of a signal processing circuit according to the disclosure.

In order to make the objectives, technical solutions and advantages of the disclosure clearer, the technical solutions in the disclosure will be described clearly and completely below with reference to the accompanying drawings in the disclosure. It is apparent that the described embodiments are some rather than all of the embodiments of the present disclosure. Based on the embodiments in the disclosure, all other embodiments obtained by those of ordinary skill in the art without creative efforts shall fall within the protection scope of the present disclosure.

The terms such as "first", "second", "third", and "fourth" in the description and claims of the present disclosure and the above accompanying drawings are used to distinguish similar objects and are not necessarily used to describe a specific order or sequence. It should be understood that the data so used may be interchanged under appropriate circumstances such that the embodiments of the present disclosure described herein can, for example, be practiced in sequences other than those illustrated or described herein. Furthermore, the terms "including" and "having", and any variations thereof, are intended to cover non-exclusive inclusion, for example, a process, method, system, product or device including a series of steps or units is not necessarily limited to those expressly listed, rather other steps or units not expressly listed or inherent to the process, method, product or device may be included.

In the present disclosure, different signals are marked in complete spelling and/or abbreviation, and the specifics are as follows.

Command address signal is abbreviated as C/A signal.
Even clock is abbreviated as Even_Clk.
Odd clock is abbreviated as Odd_Clk.
Control signal is abbreviated as CMD.
Reference clock is abbreviated as CLK.
Even command address signal is abbreviated as Even_C/A signal.
Odd command address signal is abbreviated as Odd_C/A signal.
Fused signal is abbreviated as Output_C/A signal.
Even control signal is abbreviated as Even_CMD.
Odd control signal is abbreviated as Odd_CMD.

The present disclosure provides a signal processing circuit, a chip and an electronic device. The circuit includes a first signal latch circuit, a second signal latch circuit, and a decoder. The first signal latch circuit receives a command address signal and is driven by an even clock; the second signal latch circuit receives the command address signal and is driven by an odd clock; and the decoder is connected to the first signal latch circuit and the second signal latch circuit, and outputs a control signal. A frequency of the even clock and a frequency of the odd clock are both equal to half a frequency of a reference clock, and a rising edge of the even clock and a rising edge of the odd clock are aligned with a rising edge of the reference clock. By the signal processing circuit, the chip and the electronic device provided in the disclosure, the collection, decoding and control of the command address signal under the parity clock can be realized.

FIG. 1 illustrates a first schematic structural diagram of a signal processing circuit according to the disclosure. As illustrated in FIG. 1, the signal processing circuit includes a first signal latch circuit 10, a second signal latch circuit 20, and a decoder 30.

The first signal latch circuit 10 receives a command address signal and is driven by an Even_Clk.

The second signal latch circuit 20 receives the command address signal and is driven by an Odd_Clk.

The decoder 30 is connected to the first signal latch circuit 10 and the second signal latch circuit 20, and outputs a control signal.

A frequency of the Even_Clk and a frequency of the Odd_Clk are both equal to half of a frequency of a CLK, and a rising edge of the Even_Clk and a rising edge of the Odd_Clk are aligned with a rising edge of the CLK.

The first signal latch circuit 10 is configured to process command address signal (C/A) signal and the Even_Clk to obtain an even command address (Even_C/A) signal, and provides the Even_C/A signal to the decoder 30.

The second signal latch circuit 20 is configured to process the C/A signal and Odd_Clk to obtain an odd command address (Odd_C/A) signal, and provides the Odd_C/A signal to the decoder 30.

The decoder 30 is configured to process the Even_C/A signal and the Odd_C/A signal, and output a control signal (CMD).

In the signal processing circuit provided in the embodiments of FIG. 1, the first signal latch circuit 10 receives the command address signal and is driven by the Even_Clk; the second signal latch circuit 20 receives the command address signal and is driven by the Odd_Clk; the decoder 30 is connected to the first signal latch circuit 10 and the second signal latch circuit 20, and outputs the control signal. In this way, the collection, decoding and control the command address signal under the parity clock can be realized.

Figure 2:
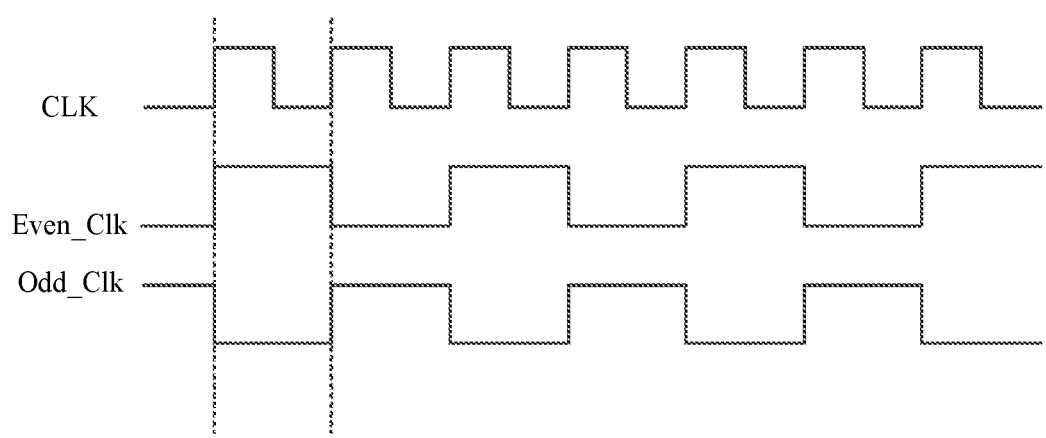
FIG. 2 illustrates a first timing sequence diagram according to the disclosure.

FIG. 2 illustrates a first timing sequence diagram according to the disclosure. As illustrated in FIG. 2, the first timing sequence diagram includes the timing sequences respectively corresponding to Even_Clk, Odd_Clk and CLK.

In FIG. 2, a rising edge of Even_Clk and a rising edge of Odd_Clk are both aligned with a rising edge of CLK. The clock cycles of Even_Clk and Odd_Clk are both twice the clock cycle of CLK, and therefore, the frequencies of Even_Clk and Odd_Clk are both equal to half of the frequency of CLK.

In the disclosure, under the conditions that the frequencies of Even_Clk and Odd_Clk are both equal to half of the frequency of CLK, and the rising edges of Even_Clk and Odd_Clk are both aligned with the rising edge of CLK, Even_Clk and Odd_Clk have a same duty cycle. The duty cycle may be equal to 50% or may be less than 50%.

It should be noted that when the duty cycle is equal to 50%, the respective timing sequences of Even_Clk and Odd_Clk are illustrated in FIG. 2. When the duty cycle is less than 50%, the respective timing sequences of Even_Clk and Odd_Clk are illustrated in FIG. 3 below.

Figure 3:
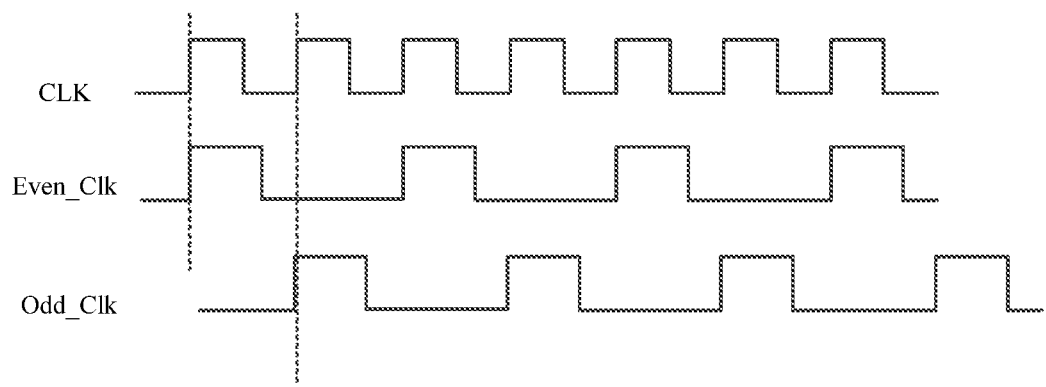
FIG. 3 illustrates a second timing sequence diagram according to the disclosure.

FIG. 3 illustrates a second timing sequence diagram according to the disclosure. As illustrated in FIG. 3, the second timing sequence diagram includes the timing sequences respectively corresponding to Even_Clk, Odd_Clk and CLK.

In FIG. 3, rising edges of Even_Clk and Odd_Clk are both aligned with a rising edge of CLK. The clock cycles of Even_Clk and Odd_Clk are both twice the clock cycle of CLK, and therefore, the frequencies of Even_Clk and Odd_Clk are both equal to half of the frequency of CLK. Even_Clk and Odd_Clk have a same duty cycle, and the duty cycle is less than 50%, for example, it may be 40% or 30%, etc.

In the above FIGS. 1 to 3, rising edges of Even_Clk and Odd_Clk are both aligned with a rising edge of CLK, which can ensure the correct sampling time of Even_Clk and Odd_Clk for the C/A signal.

Figure 4:
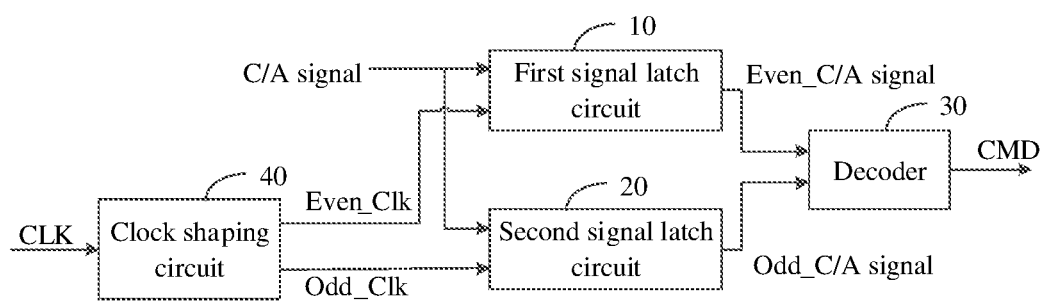
FIG. 4 illustrates a second schematic structural diagram of the signal processing circuit according to the disclosure.

FIG. 4 illustrates a second schematic structural diagram of a signal processing circuit according to the disclosure. On the basis of FIG. 1, as illustrated in FIG. 4, the signal processing circuit further includes a clock shaping circuit 40.

The clock shaping circuit 40 receives a CLK and outputs Even_Clk and Odd_Clk.

Specifically, the clock shaping circuit 40 is respectively connected to the second signal latch circuit 20 and the first signal latch circuit 10. The clock shaping circuit 40 outputs Even_Clk to the first signal latch circuit 10 and outputs Odd_Clk to the second signal latch circuit 20.

Specifically, the clock shaping circuit 40 is configured to process the CLK to obtain the timing sequences respectively corresponding to Even_Clk and Odd_Clk as illustrated in FIG. 2, or to obtain the timing sequences respectively corresponding to Even_Clk and Odd_Clk as illustrated in FIG. 3.

In a possible design, in order to obtain the timing sequences respectively corresponding to Even_Clk and Odd_Clk as illustrated in FIG. 2, the clock shaping circuit 40 may perform the following operation: reducing the frequency of CLK by half to obtain Even_Clk; and performing level inversion on Even_Clk (converting a high level of Even_Clk to low level, and converting a low level of Even_Clk to high level) to obtain Odd_Clk. Even_Clk has a same duty cycle as Odd_Clk, and the duty cycle is equal to 50%.

In a possible design, in order to obtain the timing sequences respectively corresponding to Even_Clk and Odd_Clk as illustrated in FIG. 3, the clock shaping circuit 40 may perform the following operation: reducing the frequency of CLK by half to obtain the first Even_Clk; performing level inversion on the first Even_Clk (converting a high level of the first Even_Clk to a low level, and converting a low level of the first Even_Clk to a high level) to obtain the first Odd_Clk; adjusting the duty cycle of the first Even_Clk to obtain Even_Clk; adjusting the duty cycle of the first Odd_Clk to obtain Odd_Clk. Even_Clk has a same duty cycle as Odd_Clk, and the duty cycle is less than 50%.

In the disclosure, the clock shaping circuit 40 illustrated in FIG. 4 outputs Even_Clk and Odd_Clk with the same duty cycle less than 50%, so as to avoid clock overlapping glitches when the Even_C/A signal and the Odd_C/A signal are combined.

Figure 5:
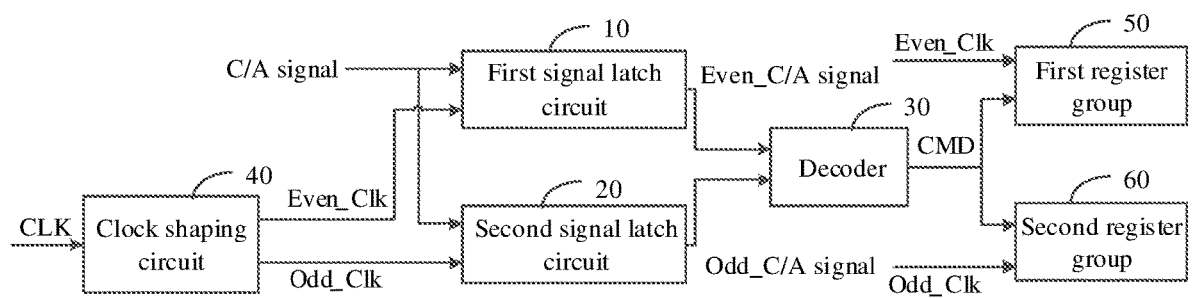
FIG. 5 illustrates a third schematic structural diagram of the signal processing circuit according to the disclosure.

FIG. 5 illustrates a third schematic structural diagram of a signal processing circuit according to the disclosure. On the basis of FIG. 4, as illustrated in FIG. 5, the signal processing circuit further includes a first register group 50 and a second register group 60.

The first register group 50 receives a CMD and is driven by Even_Clk.

The second register group 60 receives the CMD and is driven by Odd_Clk.

Specifically, the first register group 50 is respectively connected to the decoder 30 and the clock shaping circuit 40, and the first register group 50 receives the CMD output by the decoder 30 and Even_Clk output by the clock shaping circuit 40. The CMD signal can be understood as being arranged in natural numbers from 0 to n in the time axis. The CMD signal is at a low level of 0 or a high level of 1 in amplitude. The first register group 50 is driven by the clock Even_Clk and is configured to store CMD signals corresponding to even numbers such as 0, 2, and 4 in the time axis.

Specifically, the second register group 60 is respectively connected to the decoder 30 and the clock shaping circuit 40, and the second register group 60 receives the CMD output by the decoder 30 and the Odd_Clk output by the clock shaping circuit 40. The CMD signal can be understood as being arranged in natural numbers from 0 to n in the time axis. The CMD signal is at a low level of 0 or a high level of 1 in amplitude. The second register group 60 is driven by the clock Odd_Clk and is configured to store CMD signals corresponding to odd numbers such as 1, 3, and 5 in the time axis.

Figure 6:
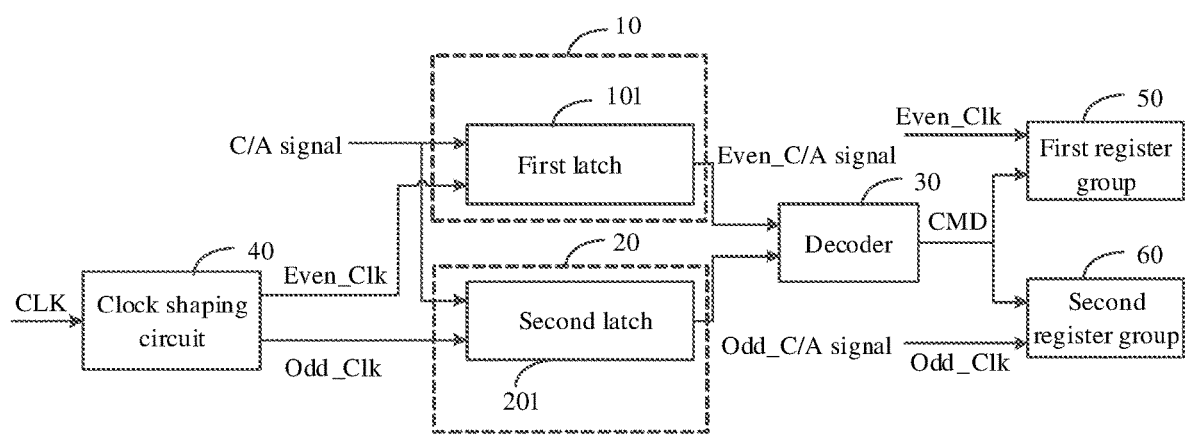
FIG. 6 illustrates a fourth schematic structural diagram of the signal processing circuit according to the disclosure.

FIG. 6 illustrates a fourth schematic structural diagram of a signal processing circuit according to the disclosure. On the basis of FIG. 5, as illustrated in FIG. 6, the first signal latch circuit 10 includes a first latch 101, and the second signal latch circuit 20 includes a second latch 201.

The first latch 101 and the second latch 201 have the same structure.

The structure of the first latch 101 will be described below with reference to FIGS. 7 to 9.

Figure 7:
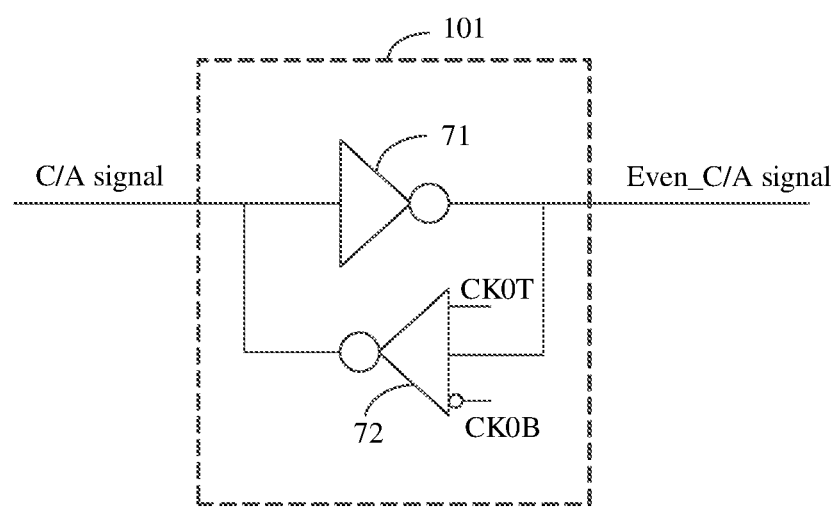
FIG. 7 illustrates a first schematic structural diagram of a first latch according to the disclosure.

FIG. 7 illustrates a first schematic structural diagram of a first latch according to the disclosure. As illustrated in FIG. 7, the first latch 101 includes a first inverter 71 and a second inverter 72.

A head end of first inverter 71 is connected to a tail end of the second inverter 72, and a tail end of the first inverter 71 is connected to a head end of the second inverter. A control terminal of the second inverter 72 is further connected to Even_Clk (CK0T is connected to the Even_Clk clock, and CK0B is connected to an inverted clock of Even_Clk).

A control terminal of the first inverter 71 receives a C/A signal, and an output terminal of the first inverter 71 outputs an Even_C/A signal. The output terminal of the first inverter 71 is connected to a first control terminal of the second inverter 72, a second control terminal of the second inverter 72 receives a CK0T signal, and a third control terminal of the second inverter 72 receives a CK0B signal.

Figure 8:
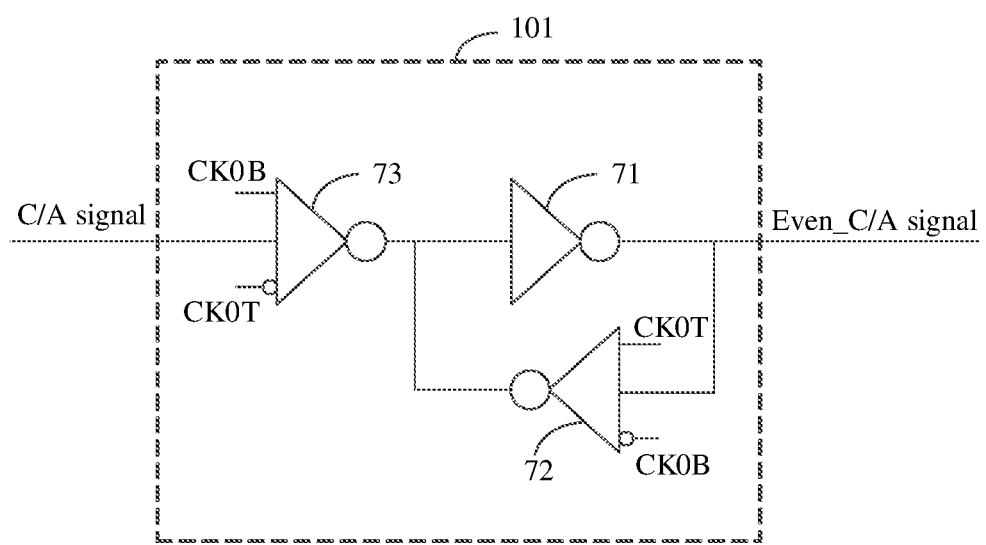
FIG. 8 illustrates a second schematic structural diagram of the first latch according to the disclosure.

FIG. 8 illustrates a second schematic structural diagram of the first latch according to the disclosure. On the basis of FIG. 7, as illustrated in FIG. 8, the first latch 101 includes a first inverter 71, a second inverter 72 and a third inverter 73.

A control terminal of the third inverter 73 receives a command address signal and an Even_Clk. Specifically, a first control terminal of the third inverter 73 receives the C/A signal, a second control terminal of the third inverter 73 is connected to a CK0B signal, and a third control terminal of the third inverter 73 is connected to a CK0T signal. The CK0T signal is connected to the Even_Clk clock signal, and the CK0B signal is connected to an inverted clock signal of Even_Clk.

An output terminal of the third inverter 73 is connected to the control terminal of the first inverter 71 and the output terminal of the second inverter 72 respectively, and the output terminal of the first inverter 71 outputs the Even_C/A signal.

Figure 9:
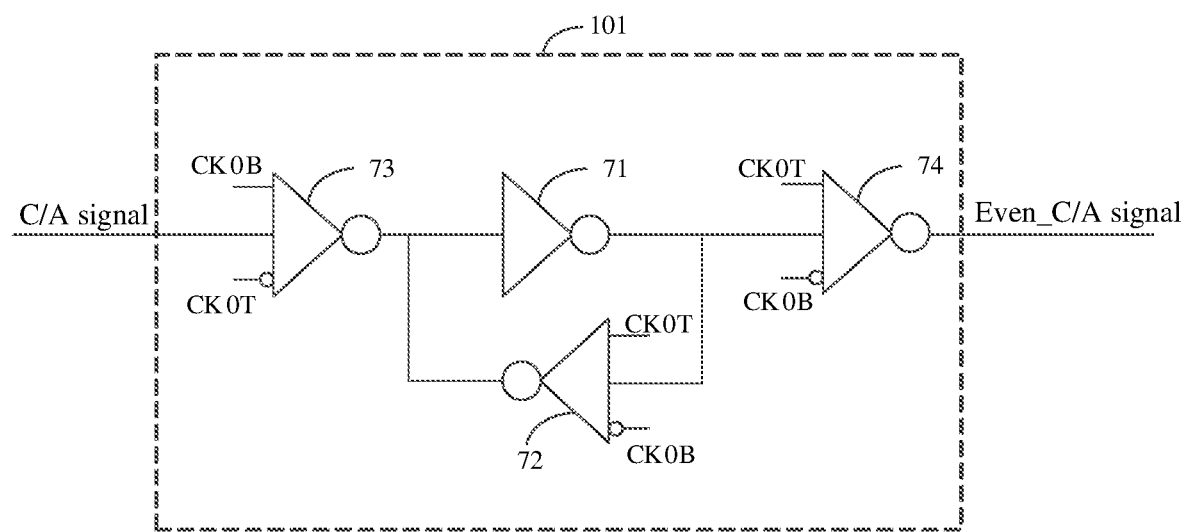
FIG. 9 illustrates a third schematic structural diagram of the first latch according to the disclosure.

FIG. 9 illustrates a third schematic structural diagram of the first latch according to the disclosure. On the basis of FIG. 8, as illustrated in FIG. 9, the first latch 101 includes a first inverter 71, a second inverter 72, a third inverter 73 and a fourth inverter 74.

A control terminal of the fourth inverter 74 is connected to the output terminal of the first inverter 71 and the Even_Clk. Specifically, a first control terminal of the fourth inverter 74 is connected to the output terminal of the first inverter 71, a second control terminal of the fourth inverter 74 is connected to the CK0T signal, and a third control terminal of the fourth inverter 74 is connected to the CK0B signal, and an output terminal of the fourth inverter 74 outputs the Even_C/A signal. The CK0T signal is connected to the Even_Clk clock signal, and the CK0B signal is connected to the inverted clock signal of Even_Clk.

In the disclosure, the first latch 101 and the second latch 201 have the same structure, so the second latch 201 will be described below with reference to the embodiment in FIG. 10.

Figure 10:
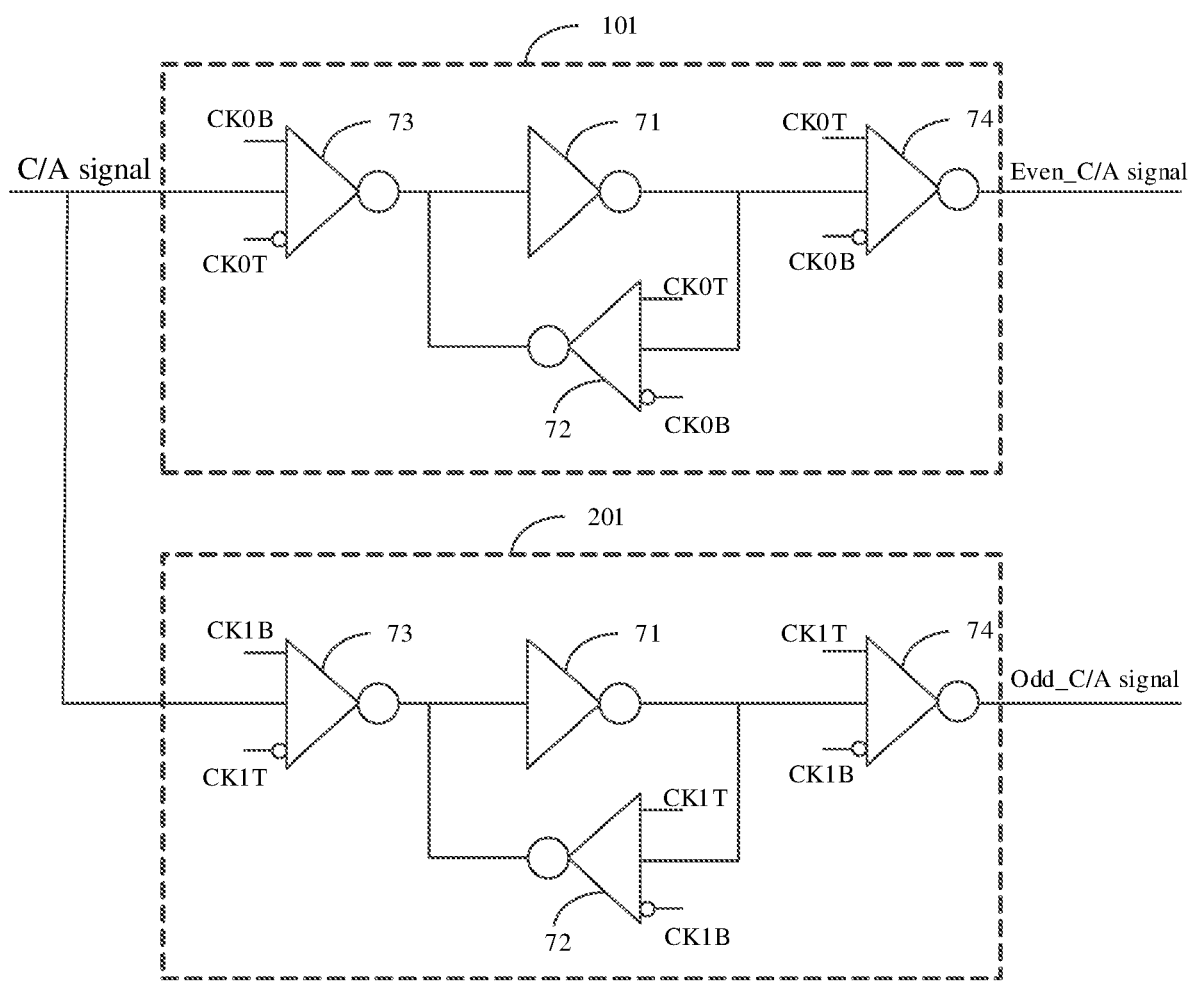
FIG. 10 illustrates a schematic structural diagram of the first latch and a second latch according to the disclosure.

FIG. 10 illustrates a schematic structural diagram of the first latch and a second latch according to the disclosure. On the basis of FIG. 9, as illustrated in FIG. 10, the second latch 201 includes a first inverter 71, a second inverter 72, a third inverter 73 and a fourth inverter 74.

In the second latch 201, a control terminal of the third inverter 73 is connected to a C/A signal and Odd_Clk. Specifically, a first control terminal of the third inverter 73 receives the C/A signal, a second control terminal of the inverter 73 receives a CK1B signal, and a third control terminal of the third inverter 73 receives a CK1T signal. The CK1T signal is connected to an Odd_Clk clock signal, and the CK1B signal is connected to an inverted clock signal of Odd_Clk.

A control terminal of the second inverter 72 is connected to an output terminal of the first inverter 71 and Odd_Clk. Specifically, a first control terminal of the second inverter 72 is connected to the output terminal of the first inverter 71, a second control terminal of the second inverter 72 is connected to the CK1T signal, and a third control terminal of the second inverter 72 is connected to the CK1B signal. The CK1T signal is connected to the Odd_Clk clock signal, and the CK1B signal is connected to the inverted clock signal of Odd_Clk.

A control terminal of the fourth inverter 74 is connected to the output terminal of the first inverter 71 and Odd_Clk. Specifically, a first control terminal of the fourth inverter 74 is connected to the output terminal of the first inverter 71, a second control terminal of the fourth inverter 74 is connected to the CK1T signal, a third control terminal of the fourth inverter 74 is connected to the CK1B signal, and an output terminal of the fourth inverter 74 outputs an Odd_C/A signal.

Figure 11:
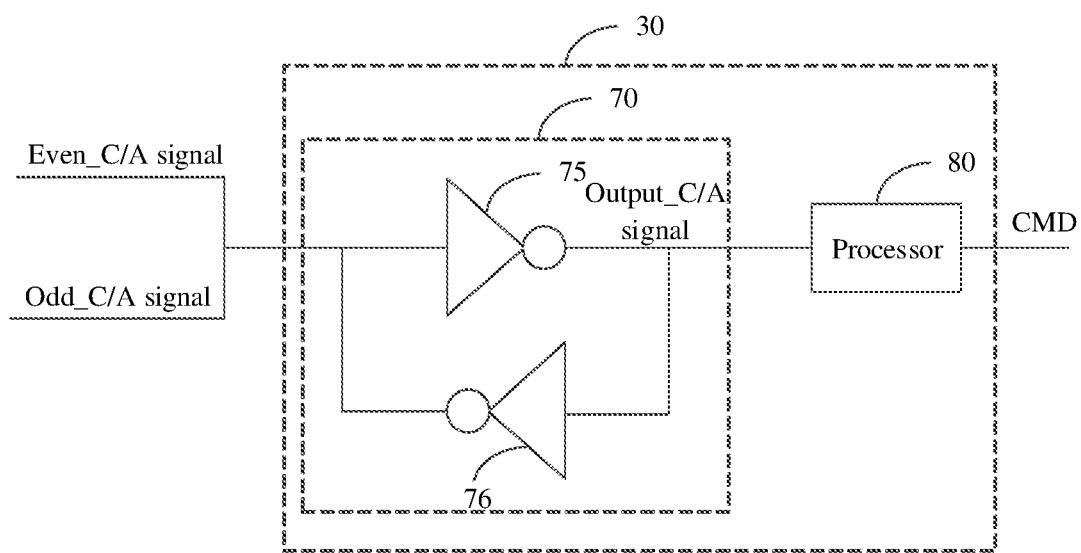
FIG. 11 illustrates a schematic structural diagram of a decoder according to the disclosure.

FIG. 11 illustrates a schematic structural diagram of a decoder according to the disclosure. As illustrated in FIG. 11, the decoder 30 includes a third latch 70 and a processor 80.

The third latch 70 includes a fifth inverter 75 and a sixth inverter 76. A head end of the fifth inverter 75 is connected to a tail end of the sixth inverter 76, and a tail end of the fifth inverter 75 is connected to a head end of the sixth inverter 76.

Specifically, a control terminal of the fifth inverter 75 is connected to the output terminal of the first signal latch circuit 10 to receive the Even_C/A signal. The control terminal of the fifth inverter 75 is further connected to the output terminal of the second signal latch circuit 20, to receive the Odd_C/A signal. The control terminal of the fifth inverter 75 is further connected to an output terminal of the sixth inverter 76. An output terminal of the fifth inverter 75 is connected to a control terminal of the sixth inverter 76.

The third latch 70 is configured to combine the Even_C/A signal and the Odd_C/A signal, and to output the Output_C/A signal.

Furthermore, the processor 80 processes the Output_C/A signal and outputs the CMD.

In the disclosure, the Even_C/A signal and the Odd_C/A signal are combined by the third latch 70 to output the Output_C/A signal, which can reduce the number of decoders 30 used and greatly save the area of the layout design of the signal processor.

Figure 12:
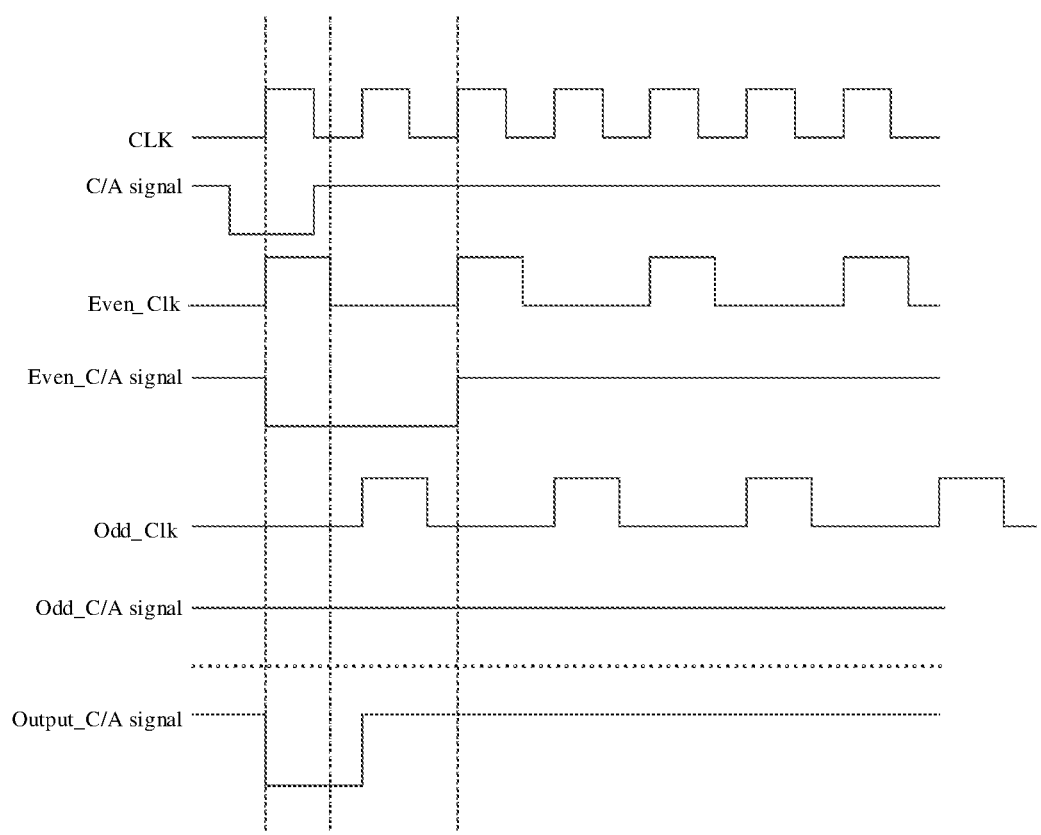
FIG. 12 illustrates a third timing sequence diagram according to the disclosure.

FIG. 12 illustrates a third timing sequence diagram according to the disclosure. As illustrated in FIG. 12, the timing sequence diagram includes timing sequences respectively corresponding to CLK, C/A signal, Even_Clk, Even_C/A signal, Odd_Clk, Odd_C/A signal, and Output_C/A signal.

In FIG. 12, the duty cycles of Even_Clk and Odd_Clk are both less than 50%.

The Output_C/A signal formed by combining the Even_C/A signal and the Odd_C/A signal is referred to as a 1N command.

The principle of implementing the 1N command is as follows: the input C/A signal is a 1N command. If sampling is performed using Even_Clk, the output Even_C/A signal is a 2N command; and if sampling is performed using Odd_Clk, the output Odd_C/A signal is also 2N command. Since the output of the flip-flop is driven by the rising edge of the clock, the Output_C/A signal output after short-circuiting and combining the two 2N commands is a 1N command.

In the disclosure, Even_Clk and Odd_Clk with a duty cycle of less than 50% are combined, which can avoid the problem of clock overlapping glitches in the process of combining the Even_C/A signal (2N command) and the Odd_C/A signal (2N command).

Furthermore, rising edges of Even_Clk and Odd_Clk are both aligned with a rising edge of CLK, which can ensure the correct sampling time of the parity clock.

Figure 13:
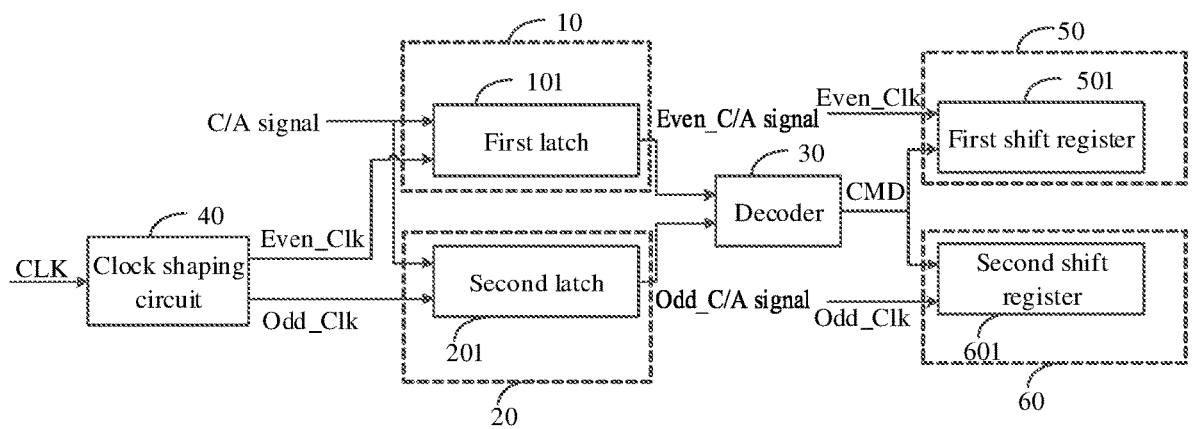
FIG. 13 illustrates a fifth schematic structural diagram of the signal processing circuit according to the disclosure.

FIG. 13 illustrates a fifth schematic structural diagram of a signal processing circuit according to the disclosure. On the basis of FIG. 6, as illustrated in FIG. 13, the first register group 50 includes a first shift register 501, and the second register group 60 includes a second shift register 601. The first shift register 501 has a same circuit structure as the second shift register 601.

In the disclosure, the advantage of parity sampling shift is retained in the instruction shift circuits such as AL/CL after the 1N command is output. Except for the first command collection, the first register group 50 and the second register group 60 both have a timing margin (Timing Margin) of 2 periodic windows.

When subsequent instructions require timing shifts such as AL and CL, Odd_Clk and Even_Clk are used again to sample the Output_C/A signal (or CMD signal). The first shift register adopts Even_Clk and the second shift register adopts Odd_Clk, so that each shift is two cycles, which can reduce the number of shifts, so that the signal processing circuit will have a greater margin for setup and hold time.

The disclosure further provides another signal processing circuit, and the structure of which will be described below with reference to specific embodiments.

Figure 14:
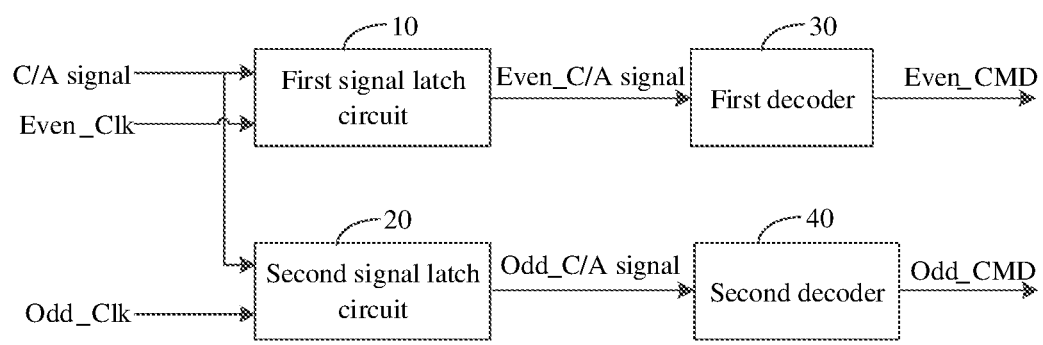
FIG. 14 illustrates a first schematic structural diagram of another signal processing circuit according to the disclosure.

FIG. 14 illustrates a first schematic structural diagram of another signal processing circuit according to the disclosure. As illustrated in FIG. 14, the signal processing circuit includes a first signal latch circuit 10, a second signal latch circuit 20, a first decoder 30, and a second decoder 40.

The first signal latch circuit 10 receives a command address signal and is driven by Even_Clk.

The second signal latch circuit 20 receives the command address signal and is driven by Odd_Clk.

The first decoder 30 is connected to the first signal latch circuit 10, and outputs Even_CMD.

The second decoder 40 is connected to the second signal latch circuit 20 and outputs Odd_CMD.

The frequencies of Even_Clk and Odd_Clk are both equal to half the frequency of the CLK. A rising edge of Even_Clk is aligned with a rising edge of CLK, and a falling edge of Odd_Clk is aligned with the rising edge of CLK.

Even_Clk and Odd_Clk have a same duty cycle. The duty cycle can be equal to 50% or less than 50%.

It should be noted that the timing sequence diagram of Even_Clk, Odd_Clk and CLK can refer to the embodiment in FIG. 2 or FIG. 3, and details will not be repeated herein.

In the embodiment of FIG. 14, the signal processing circuit includes a first signal latch circuit 10, a second signal latch circuit 20, a first decoder 30, and a second decoder 40. The first signal latch circuit 10 receives a command address signal and is driven by Even_Clk; the second signal latch circuit 20 receives the command address signal and is driven by Odd_Clk; the first decoder 30 is connected to the first signal latch circuit 10 and outputs Even_CMD; and the second decoder 40 is connected to the second signal latch circuit 20 and outputs Odd_CMD. The frequencies of Even_Clk and Odd_Clk are both equal to half frequency of the CLK. The rising edge of Even_Clk is aligned with the rising edge of CLK, and the falling edge of Odd_Clk is aligned with the rising edge of CLK. In this way, the command address signal can be collected, decoded and controlled under the parity clock.

Figure 15:
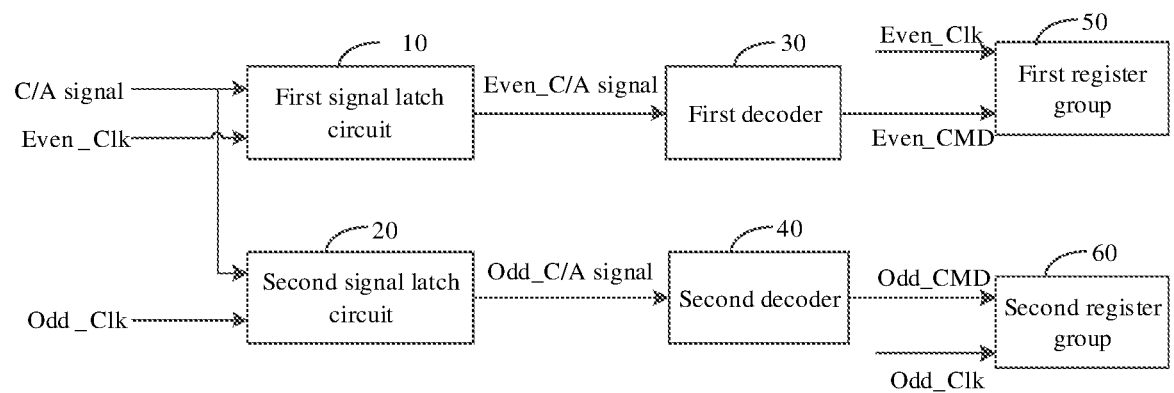
FIG. 15 illustrates a second schematic structural diagram of the another signal processing circuit according to the disclosure.

FIG. 15 illustrates a second schematic structural diagram of the another signal processing circuit according to the disclosure. On the basis of FIG. 13, as illustrated in FIG. 15, the signal processing circuit further includes a first register group 50 and a second register group 60.

The first register group 50 receives Even_CMD and is driven by Even_Clk.

The second register group 60 receives Odd_CMD and is driven by Odd_Clk.

The first register group 50 is connected to the first decoder 30 and is configured to receive Even_Clk and the Even_CMD that is provided by the first decoder 30.

The second register group 60 is connected to the second decoder 40 and is configured to receive Odd_Clk and Odd_CMD that is provided by the second decoder 40.

Figure 16:
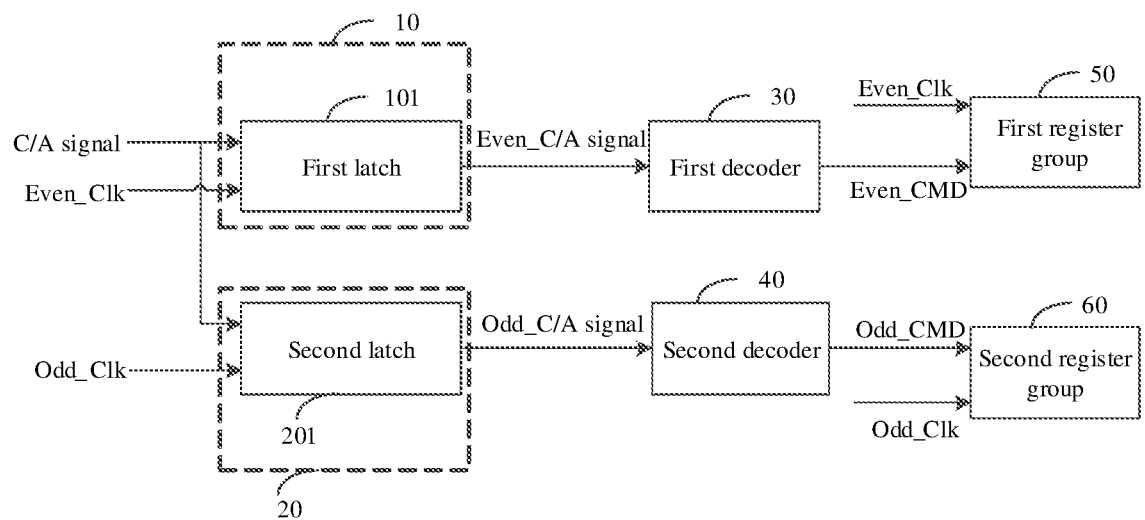
FIG. 16 illustrates a third schematic structural diagram of the another signal processing circuit according to the disclosure.

FIG. 16 illustrates a third schematic structural diagram of another signal processing circuit according to the disclosure. On the basis of FIG. 15, as illustrated in FIG. 16, the first signal latch circuit 10 includes a first latch 101, and the second signal latch circuit 20 includes a second latch 201. The first latch 101 and the second latch 201 have the same structure.

In a possible design, as illustrated in FIG. 7, the first latch 101 includes a first inverter 71 and a second inverter 72. A head end of the first inverter 71 is connected to a tail end of the second inverter 72, and a tail end of the first inverter 71 is connected to a head end of the second inverter 72. A control terminal of the second inverter 72 is further connected to Even_Clk. Details will not be repeated herein.

In another possible design, as illustrated in FIG. 8, the first latch 101 includes a first inverter 71, a second inverter 72 and a third inverter 73. A head end of the first inverter 71 is connected to a tail end of the second inverter 72, and a tail end of the first inverter 71 is connected to a head end of the second inverter 72. A control terminal of the second inverter 72 is further connected to Even_Clk, a control terminal of the third inverter 73 receives the command address signal and Even_Clk, and an output terminal of the third inverter 73 is connected to a control terminal of the first inverter 71. Details will not be repeated herein.

In another possible design, as illustrated in FIG. 9, the first latch 101 includes a first inverter 71, a second inverter 72, a third inverter 73 and a fourth inverter 74. A control terminal of the fourth inverter 74 is connected to the output terminal of the first inverter 71 and Even_Clk. Details will not be repeated herein.

On the basis of the above FIGS. 13 to 15, the first latch 101 will be described below with reference to FIG. 17.

Figure 17:
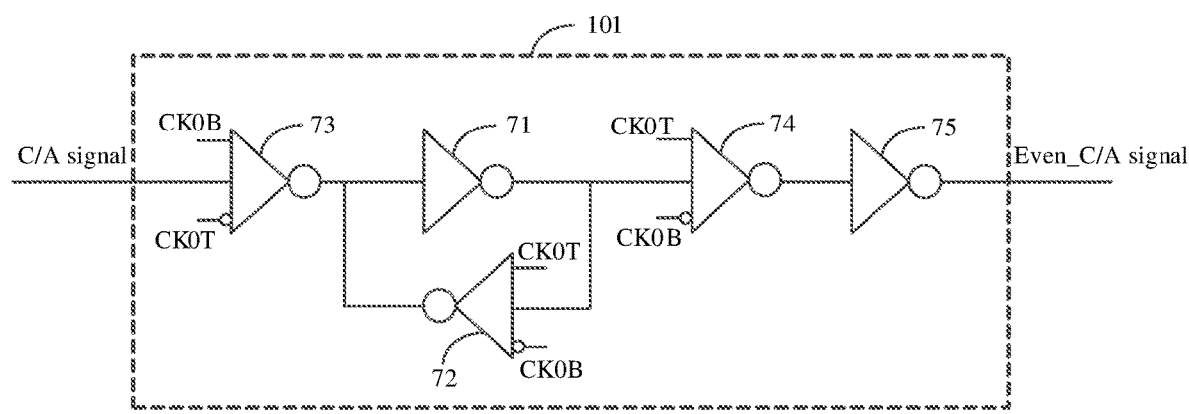
FIG. 17 illustrates a first schematic structural diagram of another latch according to the disclosure.

FIG. 17 illustrates a first schematic structural diagram of another latch according to the disclosure. As illustrated in FIG. 17, the first latch 101 includes a first inverter 71, a second inverter 72, a third inverter 73, a fourth inverter 74 and a fifth inverter 75.

In the first latch 101, the connection relationship of the first inverter 71, the second inverter 72, the third inverter 73, and the fourth inverter 74 in the first latch 101 is the same as the connection relationship of the first inverter 71, the second inverter 72, the third inverter 73, and the fourth inverter 74 in FIG. 9, which will not be described herein.

A control terminal of the fifth inverter 75 is connected to the output terminal of the fourth inverter 74, and an output terminal of the fifth inverter 75 outputs the Even_C/A signal.

Figure 18:
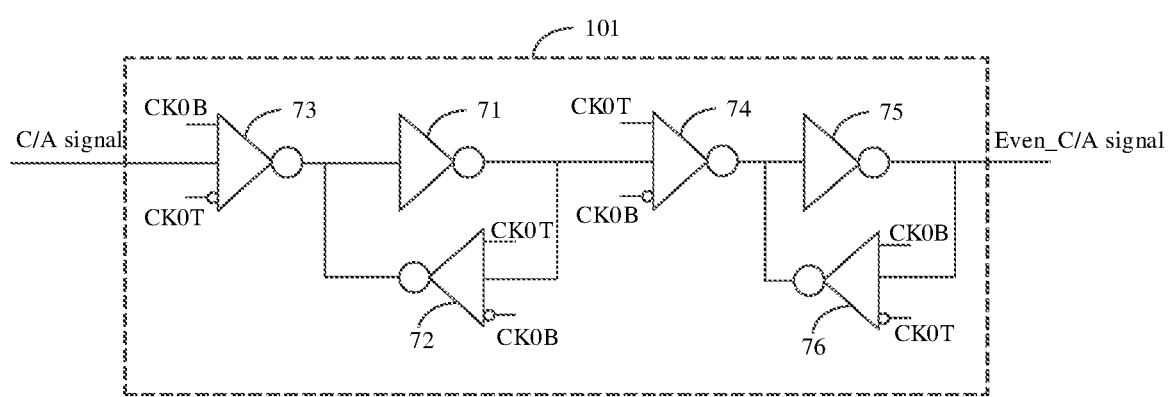
FIG. 18 illustrates a second schematic structural diagram of the another latch according to the disclosure.

FIG. 18 illustrates a second schematic structural diagram of another latch according to the disclosure. On the basis of FIG. 17, as illustrated in FIG. 18, the first latch 101 includes a first inverter 71, a second inverter 72, a third inverter 73, a fourth inverter 74, a five inverter 75 and a sixth inverter 76.

A control terminal of the sixth inverter 76 is connected to the output terminal of the fifth inverter 75 and Even_Clk, and the output terminal of the fifth inverter 75 serves as the output terminal of the first signal latch circuit 10.

The first latch 101 and the second latch 201 have the same structure, and therefore, the second latch 201 will be described below with reference to the embodiment in FIG. 19.

Figure 19:
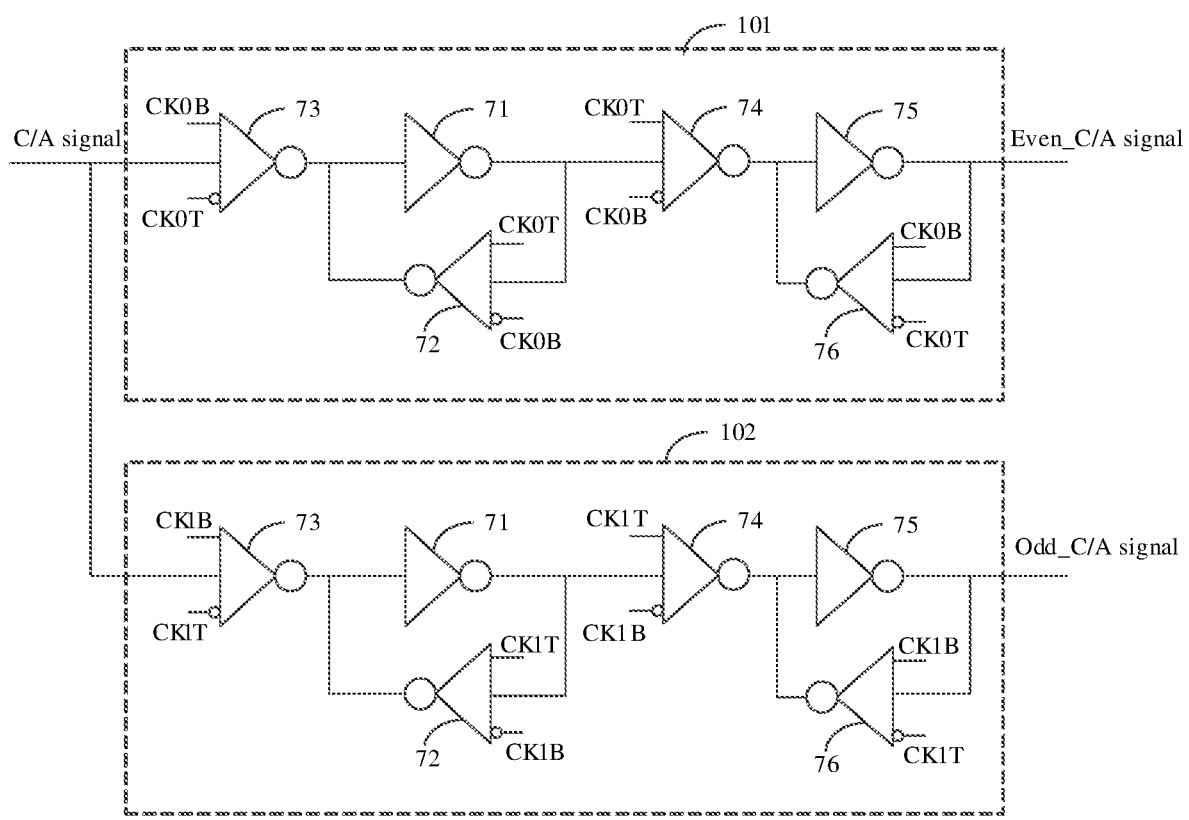
FIG. 19 illustrates a schematic structural diagram of another first latch and another second latch according to the disclosure.

FIG. 19 illustrates a schematic structural diagram of another first latch 101 and another second latch 201 according to the disclosure. On the basis of FIG. 18, as illustrated in FIG. 19, the second latch 201 includes: a first inverter 71, a second inverter 72, a third inverter 73, a fourth inverter 74, a fifth inverter 75 and a sixth inverter 76.

In the second latch 201, a control terminal of the third inverter 73 is connected to a C/A signal and Odd_Clk. Specifically, a first control terminal of the third inverter 73 receives the C/A signal, and a second control terminal of the inverter 73 receives a CK1B signal, and a third control terminal of the third inverter 73 receives a CK1T signal.

A control terminal of the second inverter 72 is connected to an output terminal of the first inverter 71 and Odd_Clk. Specifically, a first control terminal of the second inverter 72 is connected to an output terminal of the first inverter 71, a second control terminal of the second inverter 72 is connected to a CK1T signal, and a third control terminal of the second inverter 72 is connected to a CK1B signal.

A control terminal of the fourth inverter 74 is connected to the output terminal of the first inverter 71 and Odd_Clk. Specifically, a first control terminal of the fourth inverter 74 is connected to the output terminal of the first inverter 71, a first control terminal of the fourth inverter 74 is connected to the CK1T signal, and a second control terminal of the fourth inverter 74 is connected to the CK1B signal.

A control terminal of the fifth inverter 75 is connected to an output terminal of the fourth inverter 74 and an output terminal of the sixth inverter 76.

A control terminal of the sixth inverter 76 is connected to an output terminal of the fifth inverter 75 and Odd_Clk. Specifically, a first control terminal of the sixth inverter 76 is connected to the output terminal of the fifth inverter 75, a second control terminal of the sixth inverter 76 is connected to the CK1T signal, and a third control terminal of the sixth inverter 76 is connected to the CK1B signal.

The output terminal of the fifth inverter 75 outputs the Odd_C/A signal.

The CK0T signal corresponds to the Even_Clk signal, and the CK0B signal corresponds to the inverted signal of Even_Clk. The CK1T signal corresponds to the Odd_Clk signal, and the CK1T signal corresponds to the inverted signal of Odd_Clk. The inverted signal of Even_Clk has the same frequency as the Even_Clk signal and has a phase opposite to that of the Even_Clk signal; and the inverted signal of Odd_Clk has the same frequency as the Odd_Clk signal and has a phase opposite to the Odd_Clk signal.

Figure 20:
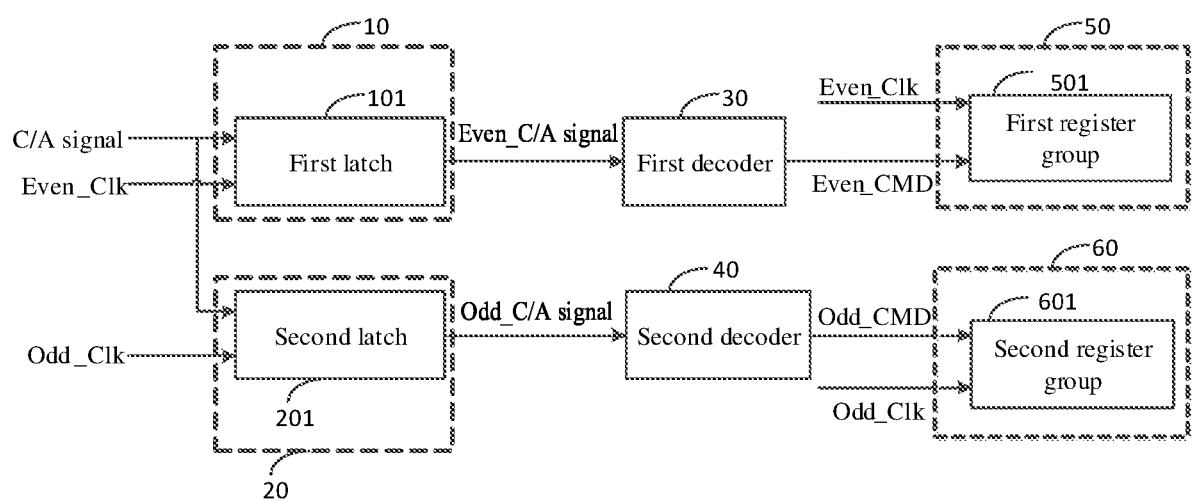
FIG. 20 illustrates a fourth schematic structural diagram of the another signal processing circuit according to the disclosure.

FIG. 20 illustrates a fourth schematic structural diagram of another signal processing circuit according to the disclosure. On the basis of FIG. 15, as illustrated in FIG. 20, in the signal processing circuit, the first register group 50 includes a first shift register 501, and the second register group 60 includes a second shift register 601. The first shift register 501 has a same circuit structure as the second shift register 601.

The first shift register 501 is connected to a first decoder 30, and the first shift register 501 receives Even_Clk and Even_CMD that is provided by the first decoder 30.

The second shift register 601 is connected to a second decoder 40, and the second shift register 601 receives Odd_Clk and Odd_CMD that is provided by the second decoder 40.

The disclosure further provides a chip including a signal processing circuit shown in the above embodiments of FIGS. 1 to 13, or including another signal processing circuit shown in the above embodiments of FIGS. 14 to 20.

The disclosure further provides an electronic device including the above chip.

Finally, it should be noted that the above embodiments are only used to illustrate the technical solutions of the present disclosure, rather than limiting. Although the disclosure has been described in detail with reference to the above embodiments, those of ordinary skill in the art should understand that: the technical solutions described in the above embodiments can still be modified, or some or all of the technical features thereof can be equivalently replaced. These modifications or replacements do not make the essence of the corresponding technical solutions deviate from the scope of the technical solutions in the embodiments of the present disclosure.

What is claimed is:

1. A signal processing circuit, comprising:
a first signal latch circuit that receives a command address signal and is driven by an even clock;
a second signal latch circuit that receives the command address signal and is driven by an odd clock; and
a decoder that is connected to the first signal latch circuit and the second signal latch circuit and outputs a control signal;
wherein a frequency of the even clock and a frequency of the odd clock are both equal to half a frequency of a reference clock, and a rising edge of the even clock and a rising edge of the odd clock are aligned with a rising edge of the reference clock; and
wherein a duty cycle of the even clock is equal to a duty cycle of the odd clock, and is less than 50%.

2. The signal processing circuit according to claim 1, further comprising:
a clock shaping circuit that receives the reference clock and outputs the even clock and the odd clock.

3. A signal processing circuit, further comprising:
a first signal latch circuit that receives a command address signal and is driven by an even clock;
a second signal latch circuit that receives the command address signal and is driven by an odd clock; and
a decoder that is connected to the first signal latch circuit and the second signal latch circuit and outputs a control signal;
wherein a frequency of the even clock and a frequency of the odd clock are both equal to half a frequency of a reference clock, and a rising edge of the even clock and a rising edge of the odd clock are aligned with a rising edge of the reference clock;
the signal processing circuit further comprising:
a clock shaping circuit that receives the reference clock and outputs the even clock and the odd clock;
a first register group that receives the control signal and is driven by the even clock; and
a second register group that receives the control signal and is driven by the odd clock.

4. The signal processing circuit according to claim 3, wherein:
the first signal latch circuit comprises a first latch;
the second signal latch circuit comprises a second latch; and
the first latch and the second latch have the same structure.

5. The signal processing circuit according to claim 4, wherein:
the first latch comprises a first inverter and a second inverter, a head end of the first inverter is connected to a tail end of the second inverter and a tail end of the first inverter is connected to a head end of the second inverter, and a control terminal of the second inverter is further connected to the even clock.

6. The signal processing circuit according to claim 5, wherein:
the first latch further comprises a third inverter, a control terminal of the third inverter receives the command address signal and the even clock, and an output terminal of the third inverter is connected to a control terminal of the first inverter.

7. The signal processing circuit according to claim 6, wherein:
the first latch further comprises a fourth inverter, a control terminal of the fourth inverter is connected to an output terminal of the first inverter and the even clock, and an output terminal of the fourth inverter serves as an output terminal of the first signal latch circuit.

8. The signal processing circuit according to claim 7, wherein:
the decoder comprises a third latch;
the third latch comprises a fifth inverter and a sixth inverter; and
a head end of the fifth inverter is connected to a tail end of the sixth inverter, and a tail end of the fifth inverter is connected to a head end of the sixth inverter.

9. The signal processing circuit according to claim 8, wherein a control terminal of the fifth inverter is connected to the output terminal of the first signal latch circuit and an output terminal of the second signal latch circuit.

10. The signal processing circuit according to claim 3, wherein:
the first register group comprises a first shift register;
the second register group comprises a second shift register; and
the first shift register has a same circuit structure as the second shift register.

11. A signal processing circuit, comprising:
a first signal latch circuit that receives a command address signal and is driven by an even clock;
a second signal latch circuit that receives the command address signal and is driven by an odd clock;
a first decoder that is connected to the first signal latch circuit and outputs an even control signal; and
a second decoder that is connected to the second signal latch circuit and outputs an odd control signal;
wherein, a frequency of the even clock and a frequency of the odd clock are both equal to half a frequency of a reference clock, and a rising edge of the even clock is aligned with a rising edge of the reference clock, and a falling edge of the odd clock is aligned with the rising edge of the reference clock.

12. The signal processing circuit according to claim 11, wherein a duty cycle of the even clock is equal to a duty cycle of the odd clock, and is equal to 50%.

13. The signal processing circuit according to claim 11, further comprising:
a first register group that receives the even control signal and is driven by the even clock, wherein the first register group comprises a first shift register; and a second register group that receives the odd control signal and is driven by the odd clock, wherein the second register group comprises a second shift register, and the first shift register has a same circuit structure as the second shift register.

14. The signal processing circuit according to claim 13, wherein:
the first signal latch circuit comprises a first latch;
the second signal latch circuit comprises a second latch; and
the first latch and the second latch have the same structure.

15. The signal processing circuit according to claim 14, wherein:
the first latch comprises a first inverter and a second inverter; a head end of the first inverter is connected to a tail end of the second inverter, and a tail end of the first inverter is connected to a head end of the second inverter; and a control terminal of the second inverter is further connected to the even clock;
the first latch further comprises a third inverter; and a control terminal of the third inverter receives the command address signal and the even clock, and an output terminal of the third inverter is connected to a control terminal of the first inverter;
the first latch further comprises a fourth inverter, and a control terminal of the fourth inverter is connected to an output terminal of the first inverter and the even clock;
the first latch further comprises a fifth inverter, and a control terminal of the fifth inverter is connected to an output terminal of the fourth inverter; and
the first latch further comprises a sixth inverter; and a control terminal of the sixth inverter is connected to an output terminal of the fifth inverter and the even clock, and an output terminal of the fifth inverter serves as an output terminal of the first signal latch circuit.

16. A chip comprising the signal processing circuit according to claim 1.

17. A chip comprising the signal processing circuit according to claim 11.

18. An electronic device comprising the chip according to claim 16.

19. An electronic device comprising the chip according to claim 17.

* * * * *